United States Patent
Kondou

(10) Patent No.: US 7,337,378 B2
(45) Date of Patent: Feb. 26, 2008

(54) SEMICONDUCTOR INTEGRATED CIRCUIT AND BURN-IN TEST METHOD THEREOF

(75) Inventor: Chiaki Kondou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 203 days.

(21) Appl. No.: 11/237,872

(22) Filed: Sep. 29, 2005

(65) Prior Publication Data
US 2006/0253750 A1  Nov. 9, 2006

(30) Foreign Application Priority Data
May 6, 2005 (JP) .............................. 2005-135196

(51) Int. Cl.
*G11C 29/00* (2006.01)
(52) U.S. Cl. ..................... 714/718; 714/724; 714/25; 714/30; 714/743; 714/733; 365/201; 702/108
(58) Field of Classification Search ..................... None
See application file for complete search history.

(56) References Cited

U.S. PATENT DOCUMENTS 5,509,134 A * 4/1996 Fandrich et al. ............ 711/103
6,014,336 A * 1/2000 Powell et al. ............... 365/201
6,198,663 B1 * 3/2001 Takizawa ................ 365/185.29
6,230,291 B1 * 5/2001 Tokieda ....................... 714/718
6,977,852 B2 * 12/2005 Naso et al. .................. 365/201

FOREIGN PATENT DOCUMENTS

JP    2002-340988 A    11/2002

* cited by examiner

*Primary Examiner*—Cynthia Britt
*Assistant Examiner*—John P Trimmings
(74) *Attorney, Agent, or Firm*—Sughrue Mion, PLLC

(57) ABSTRACT

To provide a semiconductor integrated circuit that includes a flash EEPROM on which an efficient burn-in test can be carried out and a burn-in test method thereof. By changing the level of a control signal C1 from the mode selecting unit 40, the operating mode of a functional unit 10 is switched from a normal mode to a test mode for reading out data from a ROM 30 storing a test instruction code. Then, by changing the level of the first control signal C2 in the test mode, the destination of an output of the first selection circuit 12 and the operation of the program counter 11 are switched, thereby alternately implementing a first burn-in mode for activating a flash EEPROM 20 and a second burn-in mode for activating the functional unit 10.

4 Claims, 4 Drawing Sheets

FIG . 2

| OPERATING MODE / SIGNAL NAME | C1 | C2 | S1 |
|---|---|---|---|
| NORMAL MODE | L | L | N/A |
| BURN-IN TEST MODE 1 (ACTIVATION OF FLASH EEPROM) | H | H | H |
| BURN-IN TEST MODE 2 (ACTIVATION OF FUNCTIONAL UNIT) | H | L | L |

FIG. 4

| OPERATING MODE　　　SIGNAL NAME | C1 | C2 |
|---|---|---|
| NORMAL MODE | L | L |
| BURN-IN TEST MODE (ACTIVATION OF FLASH EEPROM AND FUNCTIONAL UNIT) | H | H |

SEMICONDUCTOR INTEGRATED CIRCUIT AND BURN-IN TEST METHOD THEREOF

FIELD OF THE INVENTION

The present invention relates to a semiconductor integrated circuit and a burn-in test method thereof. More specifically, the invention relates to the semiconductor integrated circuit that includes therein a test ROM(Read Only Memory) or the like for a burn-in test and the burn-in test method thereof.

BACKGROUND OF THE INVENTION

In order to ensure reliability of semiconductor integrated circuits, burn-in tests in which products are placed in a severe environment for operation are carried out. In the burn-in test, improvement in a so-called toggle rate and stress coverage during a finite time has become a challenge. Japanese Patent Kokai Publication No. JP-P2002-340988A, for example, introduces a pseudo dynamic burn-in method in which an instruction code (program) for the test is stored in a built-in ROM and a method in which activation by scanning is used in combination, thereby activating a functional unit (an operating unit in the publication) by a higher toggle rate.

Further, there is also well known a following method: when an electrically rewritable non-volatile memory such as a so-called flash EEPROM or an EEPROM is included in the semiconductor integrated circuit, data holding test data that is called a checker or a checker bar is held for memory cells arranged in a matrix (checkerboard) form. In the data holding test data, "0"s and "1"s are arranged in a checkered pattern. Then, stress application (e.g. reading a predetermined memory cell by activation of a word line, a bit line, and a sense amplifier) is performed, thereby generating a charge loss/charge gain through a defective location. The defective location thus can be detected efficiently.

[Patent Document 1]
Japanese Patent Kokai Publication No. JP-P2002-340988A

SUMMARY OF THE DISCLOSURE

In the case of the semiconductor integrated circuit that includes the flash memory, for example, the burn-in test using the flash memory in place of the built-in ROM may be able to be carried out. However, the stress application to the functional unit described above and the stress application to the flash memory are performed using different logics. Thus, the data holding test data held in the flash memory may not be able to activate the overall functional unit. On the contrary, when the instruction code for the test is stored in the flash memory, the flash memory will have a portion in which nonuniform data that is not the data holding test data is arranged.

Then, in the case of the above-mentioned semiconductor integrate circuit as well, by placing means for storing the instruction code such as the built-in ROM described at the beginning of the specification, it becomes possible to perform both of activation of the functional unit and storage of the data holding test data in the flash memory in the burn-in test. In terms of limiting the size of the circuit within a certain range, use of an address for executing the instruction code of the built-in ROM held in a program counter as the address for activating the flash memory can be conceived.

However, the above-mentioned method has a following problem: since an address for executing the instruction code just indicates a stored address on the built-in ROM, additional consideration of modifying a higher address as necessary is required so as to use the address as the activating address for the flash memory. In addition, for preparation of the test program that ensures a high toggle rate, it is necessary to be well informed of the specifications of the functional unit and the test. Thus, the considerable number of steps is required for the preparation of the test program. Further, when a change in the capacity of the flash memory or the like is performed according to the specifications of a customer, linking the address for executing the instruction code to the address for activating the flash memory would make it more difficult to prepare and share the test program.

According to a first aspect of the present invention, there is provided a semiconductor integrated circuit comprising a first memory, a second memory with a test instruction code stored therein, a functional unit, and a mode selecting unit capable of selecting a burn-in test mode for carrying out a burn-in test and for outputting predetermined control signals when the burn-in test mode is selected. According to the control signals from the mode selecting unit, the operating mode of the functional unit is switched into the burn-in test mode. The burn-in test is constituted from a first burn-in test and a second burn-in test. The first burn-in test for performing a reading operation from the first memory with predetermined test data written therein and the second burn-in test for reading out the instruction code in the second memory, for execution and operating the functional unit can be executed independently from each other.

According to a second aspect of the present invention, there is provided a burn-in test method for a semiconductor integrated circuit comprising the steps of;
providing a semiconductor circuit comprising a first memory, a second memory with a test instruction code stored therein, a functional unit, and a mode selecting unit capable of selecting a burn-in test mode for executing a burn-in test according to an input signal;
writing predetermined test data in said first memory;
outputting predetermined control signals when the burn-in test mode is selected, thereby commanding transition to the burn-in test mode, by said mode selecting unit; and
executing a first burn-in test for performing a reading operation from said first memory with the test data written therein and a second burn-in test for reading out the instruction code in said second memory, for execution and operating said functional unit, independently to each other, in the burn-in test mode.

The meritorious effects of the present invention are summarized as follows.

According to the present invention, activation of the memory and the functional unit included in the semiconductor integrated circuit can be efficiently performed with limited resources, and preparation and sharing of a test program for performing activation of the functional unit can be facilitated.

BRIEF DESCRIPTION OF DRAWINGS

FIG. 2 is a table showing relationships among operating modes of the semiconductor integrated circuit according to the first embodiment of the present invention, control signals, and a mode switching signal;

FIG. 4 is a table showing relationships among operating modes of the semiconductor integrated circuit according to the second embodiment of the present invention, and the control signals.

PREFERRED EMBODIMENTS OF THE INVENTION

Figure 1:
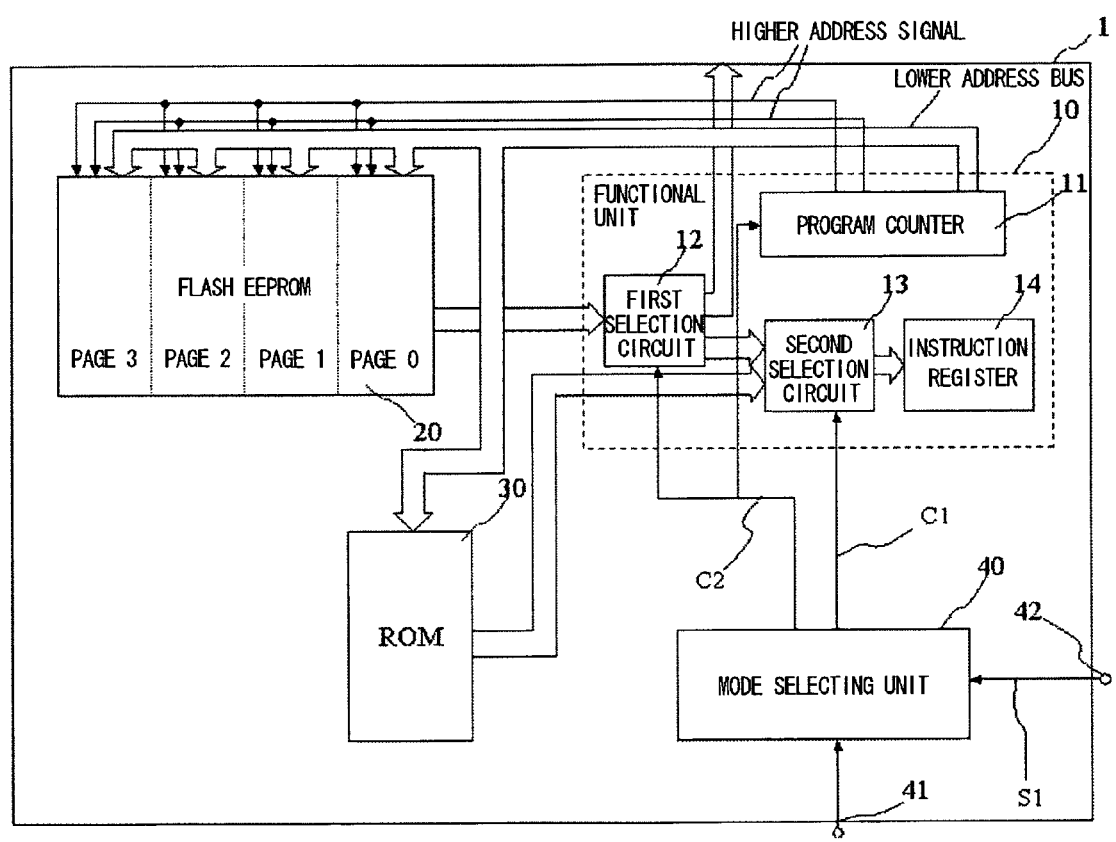
FIG. 1 is a block diagram showing a configuration of a semiconductor integrated circuit according to a first embodiment of the present invention.

Next, a best mode for carrying out the present invention will be described. FIG. 1 is a block diagram showing a configuration of a semiconductor integrated circuit according to a first embodiment of the present invention. Referring to FIG. 1, a semiconductor integrated circuit 1 including a functional unit 10, a flash EEPROM 20, a ROM 30, and a mode selecting unit 40 is shown.

The functional unit 10 indicated by a dotted line in the drawing is constituted from a CPU (Central Processing Unit) and the like, and includes a program counter 11, a first selection circuit 12, a second selection circuit 13, and an instruction register 14 for storing an instruction code supplied from the second selection circuit 13.

The program counter 11 is a register for storing an address to be read next. According to the level of a control signal C2 from the mode selecting unit 40, the program counter 11 increments a lower address starting at a leading address, for example, in order to make uniform access to pages 0 to 3 of the flash EEPROM 20, or the operation of performing address updating according to the instruction code output to the instruction register 14.

More specifically, during the activation mode of the flash EEPROM 20, the program counter 11 repeats the operation of performing sequentially address setting from the leading address the flash EEPROM 20 to a final address of the flash EEPROM 20. During the activation mode of the functional unit 10, the program counter repeats the operation of sequentially setting a specific address for reading a next instruction code written in the ROM 30.

The first selection circuit 12 outputs data read from the flash EEPROM 20 to the second selection circuit 13 or an input/output terminal not shown, according to the level of the control signal C2 from the mode selecting unit 40. The second selection circuit 13 performs switching of the source of an input between the first selection circuit 12 and the ROM 30 according to the level of the control signal C1 from the mode selecting unit 40, and outputs the input to the instruction register 14.

The flash EEPROM 20 is addressed by the program counter 11 of the functional unit 10, and can output data held therein to the first selection circuit 12. In this embodiment, checker data (data holding test data) in which 0s and 1s are alternately arranged is written in the flash EEPROM 20 in advance before the burn-in test.

The ROM 30 is addressed through a lower address bus from the program counter 11 of the functional unit 10, and can output an instruction code held therein to the second selection circuit 13.

The mode selecting unit 40 is connected to a mode setting terminal 41 and a mode switching signal input terminal 42, and outputs a control signal C1 and the control signal C2 according to an input signal from the mode setting terminal 41 and a mode switching signal S1 from the mode switching signal input terminal 42. More specifically, when a burn-in test mode is specified according to the input signal from the mode setting terminal 41, the mode selecting unit 40 switches the control signal C1 from low to high. Further, the mode selecting unit 40 sets the control signal C2 to a low level, for output, when the mode switching signal S1 becomes the low level. When the mode switching signal S1 becomes a high level, the mode selecting unit 40 sets the control signal C2 to the high level, for output.

Next, an operation of this embodiment will be described. FIG. 2 is a table showing relationships among operation modes of the semiconductor integrated circuit according to this embodiment, the control signals C1 and C2, and the mode switching signal S1. Referring to FIG. 2 as necessary, behaviors of the mode selecting unit 40 and respective components at the times of a normal operation and the burn-in test will be described.

When a normal operation mode is selected according to the level of the mode setting terminal 41, the mode selecting unit 40 sets the control signals C1 and C2 to the low level irrespective of the level of the mode switching signal S1, and operates the semiconductor integrated circuit 1 in the normal mode. In this normal mode, the following operation is performed: data in the flash EEPROM 20 at the address specified by the program counter 11 is read out, and the first selection circuit 12 outputs the data output from the flash EEPROM 20 to the second selection circuit 13. Then, the second selection circuit 13 outputs an input data to the instruction register 14.

Next, when the burn-in test mode is selected according to the level of the mode setting terminal 41, the mode selecting unit 40 sets the control signal C1 to the high level, and operates the semiconductor integrated circuit in the burn-in test mode. When the level of the mode switching signal S1 is at the high level, the mode selecting unit 40 sets the control signal C2 to the high level.

When the control signals C1 and C2 are at the high level, the circuit is brought into a burn-in test mode 1 in FIG. 2 for activating the flash EEPROM 20, and using the address sequentially incremented by the program counter 11, uniform access to the flash EEPROM 20 is started. The first selection circuit 12 performs the operation of not outputting the data output from the flash EEPROM 20 to the second selection circuit 13 but outputting the data to the input/output terminal not shown.

On the other hand, when the level of the mode switching signal S1 is switched to the low level with the burn-in test mode selected, the mode selecting unit 40 sets the control signal C2 to the low level. When the control signal C1 is at the high level and the control signal C2 is at the low level, the circuit is brought into a burn-in test mode 2 in FIG. 2 for activating the functional unit 10. Then, the second selection circuit 13 switches the source of an input from the first selection circuit 12 to the ROM 30. In this state, the fetch cycle of outputting the address specified by the instruction code in the ROM 30 at the address specified by the program counter 11 to the instruction register 14 and performing address updating according to the instruction code output to the instruction register 14 by the program counter 11 is repeated.

As described above, by switching the level of the mode switching signal S1 with the burn-in test mode selected, the burn-in test mode 1 in FIG. 2 for activating the flash EEPROM 20 and the burn-in test mode 2 in FIG. 2 for activating the functional unit 10 can be alternatively performed. By using a reset signal of which the level is switched at a predetermined period as the mode switching signal S1, automatic and alternate selection and implementation of the burn-in test mode 1 and the burn-in test mode 2 can be performed.

Further, according to this embodiment, the data holding test data in a checkerboard form can be held in the flash EEPROM 20 throughout the period of the burn-in test, so that more suitable screening can be performed.

Compared with a method in which in a configuration with an instruction code for the test stored in a built-in ROM, an address for executing the instruction code for the test is used as an input address to the flash memory and stress application is performed to the flash memory, this embodiment is more advantageous in that there is no need to incorporate therein a scheme for setting a higher address again as necessary so as to cause uniform access to be made to all the space of the flash memory. Further, this embodiment has an advantage that the need for rewriting a test program every time the capacity of the flash memory is changed is also eliminated.

Figure 3:
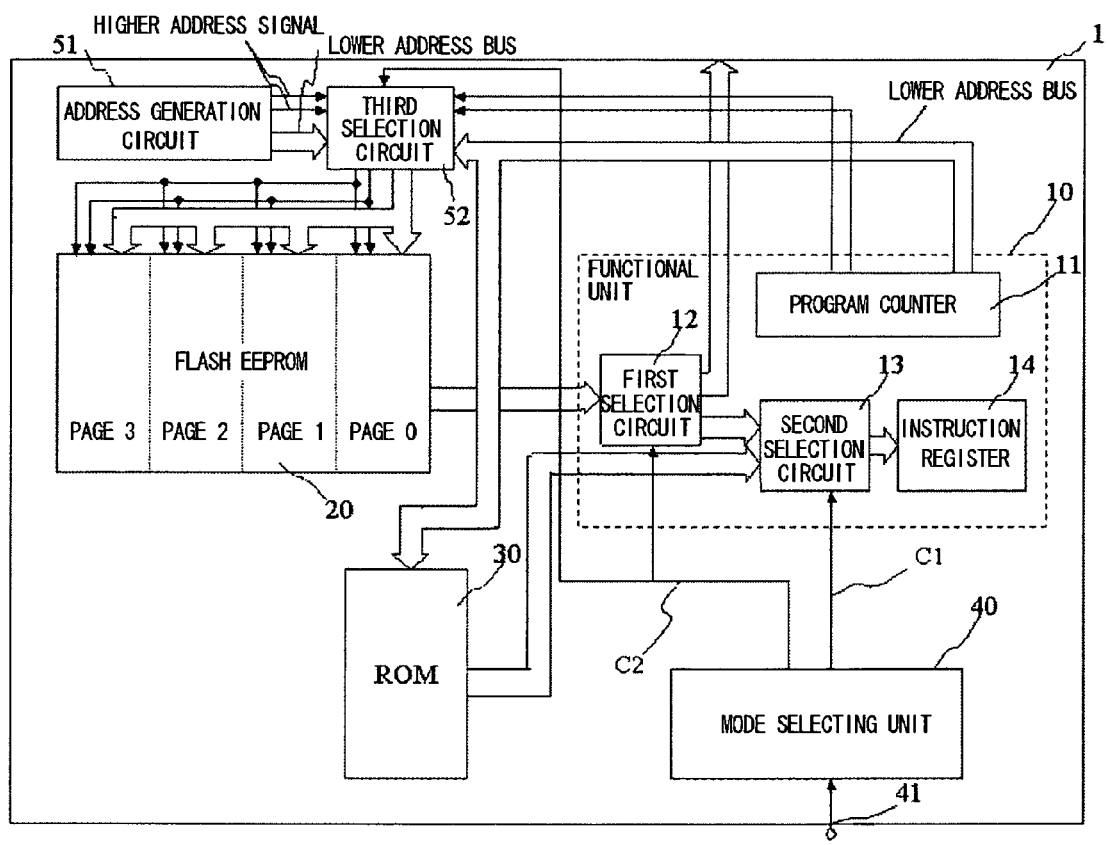
FIG. 3 is a block diagram showing a configuration of a semiconductor integrated circuit according to a second embodiment of the present invention.

Next, a second embodiment of the present invention capable of reducing the number of connecting terminals more and improving the frequency with which each component is activated during the burn-in test more will be described, as contrasted with the first embodiment. FIG. 3 is a block diagram showing a configuration of a semiconductor integrated circuit according to the second embodiment. Referring to FIG. 3, the semiconductor integrated circuit 1 provided with an address generation circuit 51 and a third selection circuit 52 in addition to the same configuration as in the first embodiment constituted from the functional unit 10, flash EEPROM 20, ROM 30, and mode selecting unit 40 is shown.

The functional unit 10 indicated by a dotted line in the drawing is the same as that in the first embodiment in that the functional unit 10 is configured from the program counter 11, first selection circuit 12, second selection circuit 13, and instruction register 14 for storing the instruction code supplied from the second selection circuit 13. The program counter 11 is so configured as to perform the address updating operation according to the instruction code output to the instruction register 14 irrespective of the level of the control signal C2 from the mode selecting unit 40.

The first selection circuit 12 and the second selection circuit 13 are the same as those in the first embodiment. The third selection circuit 52 switches the source of addressing to the flash EEPROM 20 between the program counter 11 and the address generation circuit 51, according to the level of the control signal C2 from the mode selecting unit 40.

The flash EEPROM 20 is addressed from the program counter 11 of the functional unit 10 or the address generation circuit 51 through the third selection circuit 52, and can output data held therein to the first selection circuit 12. Incidentally, in this embodiment as well, the checker data in which the 0s and the 1s are alternately arranged is written in the flash EEPROM 20 in advance before the burn-in test.

The ROM 30 is also the same as that in the first embodiment, and is addressed through the lower address bus from the program counter 11 of the functional unit 10, and can output the instruction code held therein to the second selection circuit 13.

The mode selecting unit 40 is connected to the mode setting terminal 41 and outputs the control signals C1 and C2 according to an input signal from the mode setting terminal 41. More specifically, when the burn-in test mode is specified according to the input signal from the mode setting terminal 41, the mode selecting unit 40 causes the control signals C1 and C2 to go from low to high.

Further, the address generation circuit 51 generates an address so as to make uniform access to the pages 0 to 3 in the flash EEPROM 20, as in the operation of the program counter 11 in the first embodiment in the burn-in test mode 1.

Next, an operation in this embodiment will be described. FIG. 4 is a table showing relationships among operation modes of the semiconductor integrated circuit according to this embodiment, control signal C1, and control signal C2. Referring to FIG. 4 as necessary, behaviors of the mode selecting unit 40 and respective components at the times of a normal operation and the burn-in test will be described.

When the normal operation mode is selected according to the level of the mode setting terminal 41, the mode selecting unit 40 sets both of the control signals C1 and C2 to the low level, and operates the semiconductor integrated circuit 1 in the normal mode. In this normal mode, the following operation is performed: data in the flash EEPROM 20 is read out using the address generated by the program counter 11 selected by the third selection circuit 52. Then, the first selection circuit 12 outputs the data output from the flash EEPROM 20 to the second selection circuit 13, and the second selection circuit 13 outputs the input data to the instruction register 14.

Next, when the burn-in test mode is selected according to the level of the mode setting terminal 41, the mode selecting unit 40 sets both of the control signals C1 and C2 to the high level, and operates the semiconductor integrated circuit in the burn-in test mode. That is, the circuit is brought-into the burn-in test mode in FIG. 4 for activating the functional unit 10 and the flash EEPROM 20 simultaneously. Then, using the address sequentially incremented by the address generation circuit 51 for output, uniform access to the flash EEPROM 20 and activation of the functional unit 10 by the instruction code of the ROM 30 using the address specified by the program counter 11 are simultaneously performed.

In this burn-in test mode, the first selection circuit 12 performs the operation of not outputting data sequentially output from the flash EEPROM 20 to the second selection circuit 13 but outputting the data to the input/output terminal not shown, based on the address generated by the address generation circuit 51. Further, in parallel with this, the following fetch cycle is repeated: the second selection circuit 13 outputs the instruction code of the ROM 30 at the address specified by the program counter 11 to the instruction register 14. Next, the program counter 11 performs address updating according to the instruction code output to the instruction register 14.

As described above, according to this embodiment configured to add the address generation circuit 51 and the third selection circuit 52 thereto, simultaneous activation of the functional unit 10 and the flash EEPROM 20 becomes possible. As described above, in this embodiment, the address generation circuit 51 and the third selection circuit 52 become additionally necessary, compared with the first embodiment described above. However, the need for inputting the mode switching signal is eliminated, and the stress application per unit time can be improved to be substantially doubled.

In this embodiment as well, the data holding test data in the checkerboard form can be held in the flash EEPROM 20 throughout the period of the burn-in test, so that the more suitable screening can be performed, as in the first embodiment.

In the second embodiment, for contrast with the first embodiment, the description was given, provided that the two control signals C1 and C2 are used. Naturally, the control signals C1 and C2 may be shared, and the second selection circuit may be operated according to the control signal C1.

The foregoing description was directed to the respective embodiments of the present invention. The technical range of the present invention, however, is not limited to the respective embodiments described above, as clear from a principle thereof. Various variations and replacements can be naturally performed within the scope not departing from the gist of the present invention in which the functional unit and the memory included in the semiconductor integrated circuit are activated with the data holding test data held in the memory. In the respective embodiments described above, an example where the flash EEPROM is employed as a first memory targeted for stress application was taken for description. Similarly, the stress application can be applied to even an electrically rewritable non-volatile memory such as an EEPROM, for example.

In the respective embodiments described above, as an operation of activating the memory, the activation is performed by input of an address while incrementing the address. The address may be decremented, starting at the final address. Alternatively, the activation can be performed by the generating operation of a Hamming code as well as simple dumping.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit comprising a first memory, a second memory with a test instruction code stored therein, and a functional unit, said semiconductor integrated circuit further comprising:
    a mode selecting unit for selecting a burn-in test mode for carrying out a burn-in test and for outputting predetermined control signals when the burn-in test modes selected;
    wherein said burn-in test comprises a first burn-in test and a second burn-in test, and the first burn-in test and the second burn-in test are executed independently to each other according to the predetermined control signals from said mode selecting unit; said first burn-in test performing a reading operation from said first memory with predetermined test data written therein, and said second burn-in test reading out the instruction code in said second memory, for execution and operating said functional unit;
    wherein the predetermined control signals comprise a first control signal and a second control signal, and said mode selecting unit outputs the first control signal at a first level when a normal mode for reading out a content stored in said first memory for execution is selected, and when the burn-in test mode is selected, said mode selecting unit outputs the first control signal at a second level and also outputs the second control signal;
    wherein said mode selecting unit switches a level of the second control signal with the first control signal at the second level input to said functional unit, thereby alternately switching the first burn-in test and the second burn-in test, for execution; and
    wherein said functional unit comprises:
        a first selection circuit for switching a destination of output of the content in said first memory according to the level of the second control signal; and
        a second selection circuit for switching a source of an input between said first selection circuit and said second memory according to the level of the first control signal, and outputting the input to an instruction register; and
    said semiconductor integrated circuit is so configured that switching between the normal mode for reading out the content stored in said first memory for execution and the burn-in test mode can be performed according to the first control signal, and at a time of the burn-in test mode, switching between the first burn-in test and the second burn-in test can be performed according to the level of the second control signal.

2. A semiconductor integrated circuit comprising a first memory, a second memory with a test instruction code stored therein, and a functional unit, said semiconductor integrated circuit further comprising:
    a mode selecting unit for selecting a burn-in test mode for carrying out a burn-in test and for outputting predetermined control signals when the burn-in test mode is selected;
    wherein said burn-in test comprises a first burn-in test and a second burn-in test, and the first burn-in test and the second burn-in test are executed independently to each other according to the predetermined control signals from said mode selecting unit; said first burn-in test performing a reading operation from said first memory with predetermined test data written therein, and said second burn-in test reading out the instruction code in said second memory, for execution and operating said functional unit; and
    wherein said semiconductor integrated circuit further comprises:
        an address generation circuit;
    wherein said mode selecting unit outputs the control signals at a first level when a normal mode for reading out a content stored in said first memory is selected for execution, and when the burn-in test mode is selected, said mode selecting unit outputs the control signals at a second level; and
    wherein said functional unit reads out the instruction code in said second memory, for execution, with the control signals at the second level input thereinto from said mode selecting unit, and said address generation circuit inputs into said first memory an address for reading, thereby executing the first burn-in test and the second burn-in test in parallel.

3. The semiconductor integrated circuit according to claim 2, wherein said functional unit comprises:
    a first selection circuit for switching a destination of output of the content in said first memory according to the level of the control signals; and
    a second selection circuit for switching a source of an input between said first selection circuit and said second memory according to the level of the control signals and outputs the input to an instruction register;
    said address generation circuit is connected to a third selection circuit for switching a data bus to said first memory from said functional unit to said address generation circuit according to the level of the control signals; and said semiconductor integrated circuit is so configured that the normal mode for reading out the content in said first memory for execution and the burn-in test mode for executing the first burn-in test and the second burn-in test in parallel can be switched according to the control signals.

4. A burn-in test method for a semiconductor integrated circuit comprising:

providing a semiconductor circuit comprising a first memory, a second memory with a test instruction code stored therein, a functional unit, and a mode selecting unit capable of selecting a burn-in test mode for executing a burn-in test according to an input signal;

writing predetermined test data in said first memory;

outputting predetermined control signals when the burn-in test mode is selected, thereby commanding transition to the burn-in test mode, by said mode selecting unit; and executing a first burn-in test for performing a reading operation from said first memory with the test data written therein and a second burn-in test for reading out the instruction code in said second memory, for execution and operating said functional unit, independently to each other, in the burn-in test mode;

wherein said mode selecting unit outputs first and second control signals as the predetermined control signals;

wherein said functional unit transitions to the burn-in test mode with the first signal at a second level input thereinto;

wherein said mode selecting unit changes a level of the second control signal at a predetermined time interval in the burn-in test mode, thereby alternately implementing the first burn-in test and the second burn-in test;

wherein said functional unit comprises:

a first selection circuit for switching a destination of output of a content in said first memory according to a level of the second control signal; and a second selection circuit for switching a source of an input between said first selection circuit and said second memory according to a level of the first control signal, and outputting the input to an instruction register; and wherein said mode selecting unit operates said second selection circuit according to the first control signal, operates said first selection circuit according to the second control signal with a source of an input to said instruction register switched from said first selection circuit to said second memory, and switches the destination of output of the content in said first memory, thereby alternately implementing the first burn-in test and the second burn-in test.

* * * * *